(12) United States Patent
Song et al.

(10) Patent No.: US 10,439,630 B2
(45) Date of Patent: Oct. 8, 2019

(54) ANALOG-TO-DIGITAL CONVERSION CIRCUIT, A PIXEL COMPENSATION CIRCUIT FOR DISPLAY PANEL, AND METHODS THEREOF

(71) Applicant: BOE TECHNOLOGY GROUP CO., LTD., Beijing (CN)

(72) Inventors: Chen Song, Beijing (CN); Song Meng, Beijing (CN); Danna Song, Beijing (CN); Zhongyuan Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/766,085

(22) PCT Filed: Sep. 20, 2017

(86) PCT No.: PCT/CN2017/102421
§ 371 (c)(1),
(2) Date: Apr. 5, 2018

(87) PCT Pub. No.: WO2018/205479
PCT Pub. Date: Nov. 15, 2018

(65) Prior Publication Data
US 2019/0123761 A1    Apr. 25, 2019

(30) Foreign Application Priority Data
May 8, 2017 (CN) .......................... 2017 1 0316964

(51) Int. Cl.
*H03M 1/12* (2006.01)
*H03M 1/50* (2006.01)
(Continued)

(52) U.S. Cl.
CPC .............. *H03M 1/50* (2013.01); *G09G 3/006* (2013.01); *G09G 3/3233* (2013.01); *H03M 1/10* (2013.01);
(Continued)

(58) Field of Classification Search
CPC ........... H03M 1/50; H03M 1/10; G09G 3/006
(Continued)

(56) References Cited

U.S. PATENT DOCUMENTS

| 4,940,982 A | * | 7/1990 | Gulczynski | ........... H03M 1/162 341/155 |
| 7,626,529 B2 | * | 12/2009 | Robert | .................. H03M 1/162 341/118 |

(Continued)

FOREIGN PATENT DOCUMENTS

| CN | 1822506 A | 8/2006 |
| JP | 2003143011 A | 5/2003 |
| JP | 2012124590 A | 6/2012 |

OTHER PUBLICATIONS

International Search Report & Written Opinion dated Feb. 7, 2018, regarding PCT/CN2017/102421.

*Primary Examiner* — Peguy Jean Pierre
(74) *Attorney, Agent, or Firm* — Intellectual Valley Law, P.C.

(57) ABSTRACT

The present application discloses an analog-to-digital conversion (ADC) circuit. The circuit includes an integral circuit including an operational amplifier and an integral capacitor. The circuit further includes a comparator and a timer. The operational amplifier includes a positive input terminal configured to receive a first voltage, a negative input terminal coupled to a signal-collection line configured to collect an analog current signal, and an output terminal configured to output a first output signal. The comparator is configured to compare the first output signal with a second
(Continued)

voltage to generate a second output signal to the timer. The timer is configured to start a timing operation when the operational amplifier receives the analog current signal and end the timing operation when the second output signal changes. A binary data resulted from the timing operation characterizes a digital signal corresponding to the analog current signal.

20 Claims, 3 Drawing Sheets

(51) Int. Cl.
    *G09G 3/00*     (2006.01)
    *H03M 1/10*     (2006.01)
    *G09G 3/3233*     (2016.01)

(52) U.S. Cl.
    CPC ............ *G09G 2300/0819* (2013.01); *G09G 2300/0842* (2013.01); *G09G 2320/0295* (2013.01)

(58) Field of Classification Search
    USPC .................. 341/157, 155, 118, 164, 166
    See application file for complete search history.

(56) References Cited

U.S. PATENT DOCUMENTS

| | | | |
|---|---|---|---|
| 7,652,603 B2 * | 1/2010 | Morishima | H02M 3/157 341/142 |
| 2004/0183549 A1 * | 9/2004 | Takayanagi | H04N 5/363 324/658 |
| 2014/0085123 A1 * | 3/2014 | Roytman | H03K 5/086 341/158 |
| 2016/0219234 A1 * | 7/2016 | Nishihara | H04N 5/378 |

\* cited by examiner

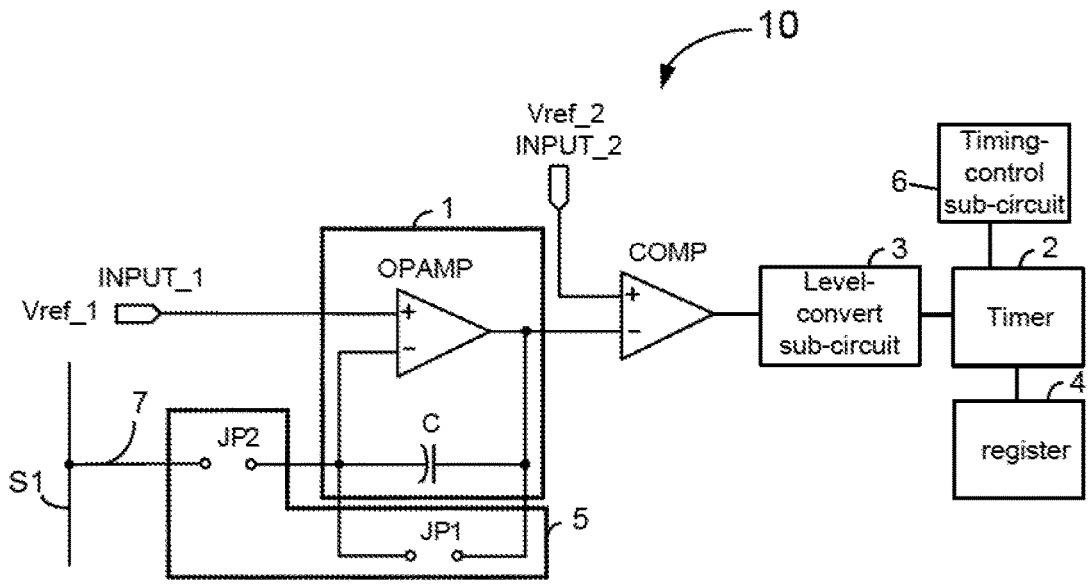

ANALOG-TO-DIGITAL CONVERSION CIRCUIT, A PIXEL COMPENSATION CIRCUIT FOR DISPLAY PANEL, AND METHODS THEREOF

CROSS-REFERENCE TO RELATED APPLICATION

This application is a national stage application under 35 U.S.C. § 371 of International Application No. PCT/CN2017/102421, filed Sep. 20, 2017, which claims priority to Chinese Patent Application No. 201710316964.0, filed May 8, 2017, the contents of which are incorporated by reference in the entirety.

TECHNICAL FIELD

The present invention relates to display technology, more particularly, to an analog-to-digital conversion (ADC) circuit, a method for converting an analog signal to a digital signal, a pixel driving circuit associated with the ADC circuit, and a method for monitoring parasitic pixel current in the pixel driving circuit.

BACKGROUND

In the conventional active-matrix organic light-emitting diode (AMOLED) display apparatus, a pixel-driving circuit includes a driving transistor for controlling a driving current through each organic light-emitting diode (OLED). The driving transistor is a thin-film transistor (TFT). Due to instability in fabrication process, drift of device parameters, and aging effect of TFT, the driving current varies from one transistor to another and drifts over time to lead to non-uniformity issue in OLED light emission across a display panel of the AMOLED display apparatus. In order to solve the problem of OLED light emission non-uniformity, an approach of external electrical compensation may be adopted to compensate the voltage signal or current signal for operating the OLED.

During the external electrical compensation, a conversion of an analog current signal collected by a signal-collection line to a digital signal is needed. But conventional approach lacks accuracy in the analog-to-digital signal conversion, which affects the effect of the electrical compensation.

SUMMARY

In an aspect, the present disclosure provides an analog-to-digital conversion (ADC) circuit. The ADC circuit includes an integral circuit including an operational amplifier and an integral capacitor; a comparator; and a timer. The operational amplifier includes a positive input terminal configured to receive a first voltage, a negative input terminal coupled to a signal-collection line configured to collect an analog current signal, and an output terminal configured to output a first output signal. The integral capacitor is coupled between the negative input terminal and the output terminal. The comparator is configured to compare the first output signal with a second voltage to generate a second output signal to the timer. The timer is configured to start a timing operation when the operational amplifier receives the analog current signal from the signal-collection line and end the timing operation when the second output signal changes. A binary data resulted from the timing operation characterizes a digital signal corresponding to the analog current signal.

Optionally, the second voltage is smaller than the first voltage and the first output signal is no greater than the first voltage.

Optionally, the ADC circuit further includes a reset sub-circuit coupled to both the negative input terminal and the output terminal of the operational amplifier. The reset sub-circuit is configured to reset the integral circuit when the timer ends a timing operation.

Optionally, the reset sub-circuit includes a first switch between the negative input terminal and the output terminal of the operational amplifier and a second switch between the signal-collection line and the negative input terminal of the operational amplifier.

Optionally, each of the first switch and the second switch is a switch transistor comprising one or more N-type or P-type transistors.

Optionally, the first switch is turned off and the second switch is turned off to connect the signal-collection line to the negative input terminal of the operational amplifier to generate the first output signal that is decreasing from the first voltage towards the second voltage in a voltage conversion period during which the second output signal is a logic level "1" and the timer performs the timing operation.

Optionally, the second output signal includes a change from the logic level "1" to a logic level "0" when the first output signal becomes smaller than the second voltage, thereby ending the voltage conversion period and starting a reset period.

Optionally, the first switch is turned on and the second switch is turned off to disconnect the signal-collection line from the negative input terminal of the operational amplifier to set the operational amplifier in a negative feedback mode to in the reset period to reset the first output signal to the first voltage.

Optionally, the ADC circuit further includes a level-conversion sub-circuit between the output terminal of the comparator and the timer, wherein the level-conversion sub-circuit is configured to reduce a voltage level of the second output signal for power saving.

Optionally, the ADC circuit further includes a timing-control sub-circuit coupled to the timer and configured to force the timer to end a timing operation and reset the timer when the timer fails to end the timing operation in a preset time period.

Optionally, the ADC circuit further includes a register coupled to the timer and configured to store the binary data resulted from the timing operation and to send the binary data to an external processor. The binary data are positively correlated to the analog current signal.

In another aspect, the present disclosure provides a method for converting an analog signal to a digital signal based on the ADC circuit described herein. The method includes operating the timer to start a timing operation when the analog current signal collected by the signal-collection line is received by the negative input terminal of the operational amplifier. Additionally, the method includes ending the timing operation when the second output signal received by the timer changes. Furthermore, the method includes storing a binary data resulted from the timing operation in a register coupled to the timer. The binary data characterizes a digital signal positively correlated to the analog current signal.

Optionally, operating the timer to start a timing operation includes outputting a first output signal from the output terminal of the operational amplifier in a positive feedback mode with a first voltage being provided to the positive input terminal and the analog current signal being provided to the negative input terminal. The first output signal is a voltage signal that is decreasing with a drop rate proportional to the analog current signal.

Optionally, operating the timer to start a timing operation further includes operating the comparator to compare the first output signal with a second voltage to generate a second output signal outputted to the timer. The second output signal is a logic level "1" if the first output signal is greater than or equal to the second voltage. The second output signal changes to a logic level "0" if the first output signal is smaller than the second voltage.

Optionally, operating the timer to start a timing operation comprises measuring a time duration of the second output signal staying at the logic level "1" before changing to the logic level "0" to obtain the binary data positively correlated to the time duration which is negatively correlated to the drop rate.

Optionally, the method further includes resetting the integral circuit when the timer ends the timing operation to set the first output signal equal to the first voltage.

In another aspect, the present disclosure provides a pixel compensation circuit of a display panel comprising the ADC circuit described herein. The signal-collection line is coupled to an driving transistor and an testing signal input terminal.

In another aspect, the present disclosure provides a method for monitoring a parasitic parameter associated with a signal-collection line coupled to a subject circuit based on the ADC circuit described herein. The method includes providing a test current signal from a test terminal to the signal-collection line. A first analog current signal is generated in the signal-collection line based on the test current signal influenced by the parasitic parameter. Additionally, the method includes collecting the first analog current signal in the signal-collection line by the negative input terminal of the operational amplifier to generate a first output signal to the comparator of the ADC circuit. The method further includes starting a timing operation by the timer when the first analog current signal is received at the negative input terminal, during which the timer receives a second output signal to be a logic level "1". Furthermore, the method includes ending the timing operation by the timer upon receiving a change of the second output signal from the logic level "1" to a logic level "0". The method further includes generating a binary data from the timing operation which characterizes a first digital signal corresponding to the first analog current signal. Moreover, the method includes determining a current calibration parameter associated with the parasitic parameter based on the first digital signal and the test current signal.

Optionally, the subject circuit is a pixel driving circuit configured to generate a driving current to a driving transistor. The driving current is yet to be compensated for driving a light-emitting device based on a data signal sent from a data line to a gate of the driving transistor. The method further includes supplying the data signal from the data line to generate a driving current passing through the driving transistor to a source terminal. Additionally, the method includes coupling the signal-collection line via a switch transistor to the source terminal to generate a second analog current signal in the signal-collection line. The method further includes collecting the second analog current signal by coupling the signal-collection line to the negative input terminal of the operational amplifier of the ADC circuit. Furthermore, the method includes starting a timing operation by the timer of the ADC circuit when the second analog current signal is received at the negative input terminal, during which the timer receives a second output signal at a logic level "1" outputted from the comparator of the ADC circuit. The method further includes ending the timing operation by the timer upon receiving a change of the second output signal from the logic level "1" to a logic level "0" and generating a binary data from the timing operation which characterizes a second digital signal corresponding to the second analog current signal. Moreover, the method includes determining the driving current based on the second digital signal and the current calibration parameter.

Optionally, the first digital signal is converted to a first current signal based on a look-up table stored in an external IC chip coupled to the ADC circuit. The current calibration parameter is a difference between the first current signal and the test current signal. The second digital signal is converted to a second current signal. The driving current equals to the sum of the second current signal and the current calibration parameter.

BRIEF DESCRIPTION OF THE FIGURES

The following drawings are merely examples for illustrative purposes according to various disclosed embodiments and are not intended to limit the scope of the present invention.

FIG. 1 is a block diagram of an analog-to-digital conversion (ADC) circuit according to an embodiment of the present disclosure.

FIG. 2 is a flow chart illustrating a method for converting analog signal to digital signal according to an embodiment of the present disclosure.

DETAILED DESCRIPTION

Figure 3:
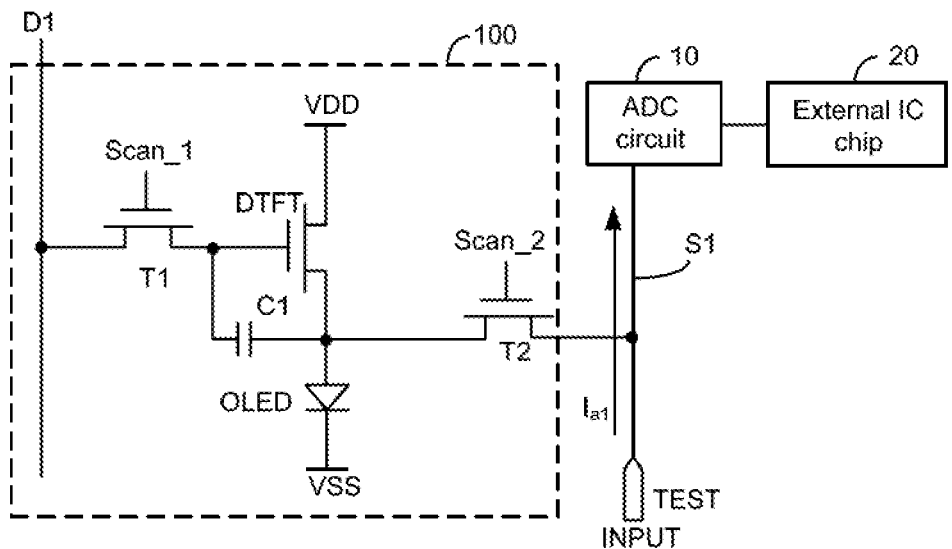
FIG. 3 is an exemplary monitoring circuit configured to monitor a parasitic parameter in a signal-collection line according to some embodiments of the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In order to improve light-emission uniformity of the AMOLED display apparatus, the present disclosure provides, inter alia, an analog-to-digital conversion circuit, a circuit for monitoring parasitic parameters in signal-collection line having the same, and methods thereof that substantially obviate one or more of the problems due to limitations and disadvantages of the related art.

In one aspect, the present disclosure provides an analog-to-digital conversion (ADC) circuit. FIG. 1 shows a simplified block diagram of an ADC circuit according to an embodiment. Referring to FIG. 1, the ADC circuit 10 is configured to convert an analog current signal collected by a signal-collection line 7 to a digital signal. The ADC circuit 10 includes an integral circuit 1, a comparator COMP, and a timer 2. The integral circuit 1 includes an operational amplifier OPAMP and an integral capacitor C. The OPAMP has a positive input terminal coupled to a first voltage-input port INPUT_1, a negative input terminal coupled to the signal-collection line 7, and an output terminal coupled to a second input terminal of the comparator COMP. The integral capacitor C is disposed between the negative input terminal of OPAMP and the output terminal of OPAMP. Optionally, the first voltage-input port INPUT_1 is provided with a first voltage Vref_1.

Referring to FIG. 1, a first input terminal of COMP is coupled to a second voltage-input port INPUT_2. An output terminal of COMP is connected to the timer 2. Optionally, one of the first input terminal and the second input terminal of COMP can be positive input terminal while the other one can be a negative input terminal. The second voltage-input port INPUT_2 is provided with a second voltage Vref_2. Optionally, Vref_2 is smaller than Vref_1.

The timer 2 is configured to start a timing operation when an analog current signal S1 collected by the signal-collection line 7 is inputted to the negative input terminal of the OPAMP. The timing operation, optionally, is to trigger a counter to count number of pulses over a time period defined as a duration of the timing operation based on certain conditions. During the time period of the timing operation, the pulses are periodically provided by a clock signal generator. Optionally, the timer 2 starts the timing operation upon receiving an output signal having a logic value from the comparator COMP. Optionally, the output signal of the comparator COMP has a logic level of "1" or "0". The timer 2 is configured to end the timing operation when the output signal of the comparator COMP changes. Optionally, the timer 2 ends the timing operation upon receiving the output signal from COMP changed its logic level from "1" to "0". The timer 2 ends the timing operation means that the counting number of pulses is stopped, yielding at least a final numerical number. Optionally, the numerical number is represented by a binary number (or data). The binary number characterizes a digital signal that is corresponding to the analog current signal S1.

Referring to FIG. 1, the ADC circuit 10 also includes a ret sub-circuit 5 including a first switch JP1 and a second switch JP2. The first switch JP1 is coupled between the negative input terminal and the output terminal of OPAMP which are also two terminals of the integral capacitor C. The second switch JP2 is coupled between the signal-collection line 7 and the negative input terminal of OPAMP. After the signal-collection line 7 collect the analog current signal S1, the analog current signal S1 is sent to the negative input terminal of the operational amplifier OPAMP by turning on the second switch JP2. This time, the timer 2 should start timing. At the same time, the first switch JP1 is turned off or disconnected so that this analog current signal S1 is able to charge the integral capacitor C.

Based on a general working principle of the operational amplifier OPAMP, the output terminal of OPAMP is configured to output an first output signal upon receiving a first input of the first voltage Vref_1 at the positive input terminal and a second input associated with the analog current signal S1 at the negative input terminal. The first output signal is characterized as a voltage signal with decreasing voltage level at a certain drop rate. In the embodiment of FIG. 1, this voltage signal drops from a first value which equals to the first voltage that has a constant level provided from the first voltage-input port INPUT_1. The drop rate is determined by the value of the analog current signal (inputted to the negative input terminal of the OPAMP) and a capacitance of the integral capacitor C. For a fixed capacitance of the integral capacitor C, different analog current signal results in different drop rate of the first output signal outputted from the output terminal of the OPAMP. The larger is current value corresponding to the analog current signal, the faster the first output signal drops, i.e., the larger is the drop rate.

Based on the working principle, the comparator COMP is configured to compare two inputs received respectively by its two input terminals and output a second output signal that has a logic value of either level "1" or level "0". Optionally, the logic level "1" is represented by a high voltage level and the logic level "0" is represented by a low voltage level. Optionally, assuming that the first input terminal is a positive input terminal and the second input terminal is a negative input terminal for the COMP, when the first input is larger than (and equal to) the second input, the comparator COMP outputs the second output signal at high voltage level corresponding to the logic level "1". In the embodiment of FIG. 1, the first input of COMP is the first output signal and the second input of COMP is the second voltage set at the Vref_2. When the first output signal of the OPAMP starts to drop from the first voltage Vref_1, it will become smaller than the second voltage Vref_2 over a certain time period depending at least on the drop rate associated with the OPAMP. At the time when the first output signal of the OPAMP is smaller than the Vref_2, i.e., the first input of COMP is smaller than the second input of COMP, the second output signal will change from the logic level "1" to a level "0", i.e., from a high voltage level to a low voltage level.

Optionally, the first input terminal of COMP can be a negative input terminal and the second input terminal of COMP a positive input terminal, then the second output signal of the COMP initially will be a low voltage level with a logic level "0" and changes to a high voltage level with a logic level "1" when the first output signal of OPAMP becomes smaller than the second voltage Vref_2.

As the timer 2 detects the change of the second output signal from the comparator COMP, the timer 2 ends the timing operation, stops further counting of pulses and records a last counted numerical number as a result of the timing operation. The numerical number is a binary number which is represented as a digital signal corresponding to the analog current signal that is used to trigger the timing operation. Thus, this completes an ADC process of converting the analog current signal collected by the signal-collection line to a digital signal. After the ADC process (i.e., after the timer 2 ends the timing operation), the timer 2 is reset so that it can be used again in a next analog-to-digital conversion process.

In the embodiment, the larger of a current value corresponding to the analog current signal, the larger of the drop rate of the first output signal outputted from the operational amplifier OPAMP. Accordingly, the shorter of a time period before the second output signal from the comparator COMP changes (from either a level "1" to a level "0", or vice versa) after the timing operation starts, the smaller in value of the binary number obtained by the timer from the timing operation.

In another embodiment, the ADC circuit 10 includes a timing-control sub-circuit 6 coupled to the timer 2. The timing-control sub-circuit 6 is configured to force the timer 2 to end a timing operation and reset the timer 2 when the timer 2 fails to end the timing operation in a preset time period. In a real-life scenario, when an analog current signal collected by the signal-collection line is very small or proximate to 0, the drop rate of the corresponding first output signal of the OPAMP is also very small, causing that the second output signal of the comparator COMP stays unchanged and the timer 2 keeps the timing operation for a very long time period. This certainly affects a next ADC process of another analog current signal. With the timing-control sub-circuit 6, a preset time period can be programmed for the timer 2. Once the time period of the timer 2 performing the timing operation surpasses this preset time period due to an analog current signal being too small, the timer 2 still ends the timing operation at the preset time period to obtain a corresponding numerical number. After the preset time period, the timer 2 is reset and ready for performing a timing operation for next ADC process. The preset time period can be adjusted and determined based on specific applications.

In another embodiment, the ADC circuit 10 also includes a level-convert sub-circuit 3 disposed between the output terminal of the comparator COMP and the timer 2. The level-convert sub-circuit 3 is configured to reduce a voltage level of the second output signal of the OPAMP for power saving.

Optionally, the ADC circuit 10 also includes a register 4 coupled to the timer 2. The register 4 is configured to record the result of the timing operation performed by the timer 2. Optionally, the register 4 is a memory chip allowing the result of each timing operation performed by the timer to be saved for future access for related applications.

Optionally, the ADC circuit includes a rest sub-circuit 5. The reset sub-circuit 5 is coupled to the negative input terminal of the operational amplifier OPAMP and the output terminal of the OPAMP and configured to reset the integral circuit 1. In particular, the reset sub-circuit 5 includes a first switch JP1 and a second switch JP2. The first switch JP1 has two terminals respectively connected to the negative input terminal and the output terminal of the OPAMP. The second switch JP2 is disposed between the signal-collection line 7 and the negative input terminal of the OPAMP.

When the ADC circuit 10 is in a signal-conversion period, during which an analog signal is collected and a timer is performing a timing operation aiming to obtain a digital signal corresponding to the analog signal, the first switch JP1 is disconnected or turned off and the second switch JP2 is connected or turned on. Then, the analog current signal can be inputted to the negative input terminal of the operational amplifier OPAMP. Alternatively, when the ADC circuit 10 is in a reset period, during which no analog signal is collected, the first switch JP1 is connected or turned on and the second switch JP2 is disconnected or turned off. Then, the output terminal connects the negative input terminal, making the operational amplifier OPAMP in a negative feedback mode and the first output signal of the OPAMP is the first voltage Vref_1 which is still an input signal inputted to the positive input terminal of the OPAMP.

Optionally, each of the first switch JP1 and the second switch JP2 is a switch transistor. Preferred, one of the first switch JP1 and the second switch JP2 is an N-type transistor and another is a P-type transistor, where both the N-type transistor and the P-type transistor have a common control signal line. In this configuration, the N-type transistor and the P-type transistor can alternatively be turned on and off to have the signal-conversion period and the reset period to occur alternatively in time.

Alternatively, the first switch JP1 and the second switch JP2 can both be NP-complementary switch. Optionally, each NP-complementary switch includes an N-type transistor and a P-type transistor as well as an inverter. The first switch JP1 and the second switch JP2 have respective two control signals in opposite polarity, i.e., one control signal for turning on one of the JP1 and the JP2 and the other control signal just being opposite for turning off another one of the JP1 and the JP2.

In this aspect, the present disclosure provides an ADC circuit configured to convert an analog current signal to a digital signal. The ADC circuit is characterized by its high conversion accuracy and being able to provide precise digital data as references for performing external electrical compensations for various kinds of circuits in different applications including pixel-driving circuit in display apparatus.

In another aspect, the present disclosure provides a method for converting an analog signal to a digital signal. FIG. 2 shows a flow chart illustrating a method for converting an analog current signal to a digital signal using the ADC circuit of FIG. 1 according to some embodiments of the present disclosure. Referring to FIG. 2, provided that an ADC circuit of FIG. 1 described herein is available, the method includes starting a timing operation by the timer of the ADC circuit upon receiving a comparator output at a logic level "1" based on an analog signal received by an integral circuit of the ADC circuit. The analog signal is an analog current signal collected by a signal-collection line and is sent to the negative input terminal of an operational amplifier in the integral circuit to trigger the timer of the ADC circuit to perform the timing operation. The integral circuit includes an integral capacitor that is charged by the analog current signal at the negative input terminal. A first output signal at the output terminal of the operational amplifier is pulled lower from a first voltage Vref_1 and eventually becomes lower than a second voltage Vref_2 at which an second output signal of the comparator changes by switching from the logic level "1" to another logic level "0".

The method also includes ending the timing operation by the timer upon receiving the comparator output that just changes to a logic level "0", leading to a binary data from the timing operation to obtain a digital signal corresponding to the analog signal. When the timer detect the change of the second output signal from the comparator, the timer ends the timing operation. The result in the timer is substantially a binary number (or data) which characterizes a digital signal corresponding to the analog current signal.

Additionally, the method includes storing the binary data resulted from the timing operation in a register and resetting the integral circuit of the ADC circuit. In particular, resetting the integral circuit includes using a reset sub-circuit to control the signal-collection line to stop inputting an analog signal to the negative input terminal of the operational amplifier and connecting the negative input terminal to the output terminal. This makes the operational amplifier working in a negative feedback mode and outputs a first output signal equal to the input voltage Vref_1 at the positive input terminal. Resetting the integral circuit also includes setting a potential level difference between two terminals of the integral capacitor equal to zero. Optionally, the resetting integral circuit can be performed after the timer ends the timing operation or can be performed before the timer starts the timing operation.

In another aspect, the present disclosure provides a pixel compensation circuit configured to provide external electrical compensation to a pixel-driving circuit for controlling image display of a display apparatus. In the embodiment, the pixel compensation circuit includes an ADC circuit substantially similar to one shown in FIG. 1 but not limits any specific circuitry structure to the pixel-driving circuit that is subjected to the external electrical compensation for enhancing image display.

In some embodiments, the present disclosure also provides a display substrate including a pixel-driving circuit, a pixel compensation circuit, where the pixel compensation circuit includes the ADC circuit described herein and an external IC chip. The external IC chip is configured to process any digital signal obtained by the ADC circuit and to provide signals and data required for making the pixel compensation. In a process of performing an external electrical compensation to the pixel-driving circuit, precisely sampling the driving current in the pixel-driving circuit is a basis for providing accurate compensation. Differences among all signal lines or data lines layout Side the display substrate and variations in processes of making the display substrate lead to different parasitic capacitance in each signal-collection line, which affects the accuracy of the pixel driving current sampling.

In yet another aspect, the present disclosure provides an exemplary monitoring circuit configured to monitor a parasitic parameter in a signal-collection line according to some embodiments of the present disclosure. Referring to FIG. 3, the monitoring circuit includes at least an ADC circuit 10 described herein coupled to a signal-collection line S1, an test input port INPUT configured to supply a test current signal, and an external IC chip 20 coupled to the ADC circuit 10 and configured to process any digital signals generated by the ADC circuit 10. In an example shown in FIG. 3, the monitoring circuit is configured to use the signal-collection line S1 to probe a pixel-driving circuit 100 to measure a parasitic parameter associated with the signal-collection line S1. The parasitic parameter, for example, is a parasitic capacitance induced by the coupling of the signal-collection line S1 with the pixel-driving circuit 100. The pixel-driving circuit 100 is merely an example based on a 2T1C circuit including a first switch transistor T1, a driving transistor DTFT, and a capacitor C1.

In the example, a test current signal of a preset value is firstly provided at the test input port INPUT. Accordingly, the signal-collection line S1 collects a first analog current signal $I_{a1}$. Due to the parasitic capacitance of the signal-collection line S1, the value of first analog current signal $I_{a1}$ is different from the preset value of the test current signal. By monitoring the first analog current signal $I_{a1}$ and comparing its value with the preset value of the test current signal, the parasitic parameter associated with the signal-collection line S1 can be deduced.

Figure 4:
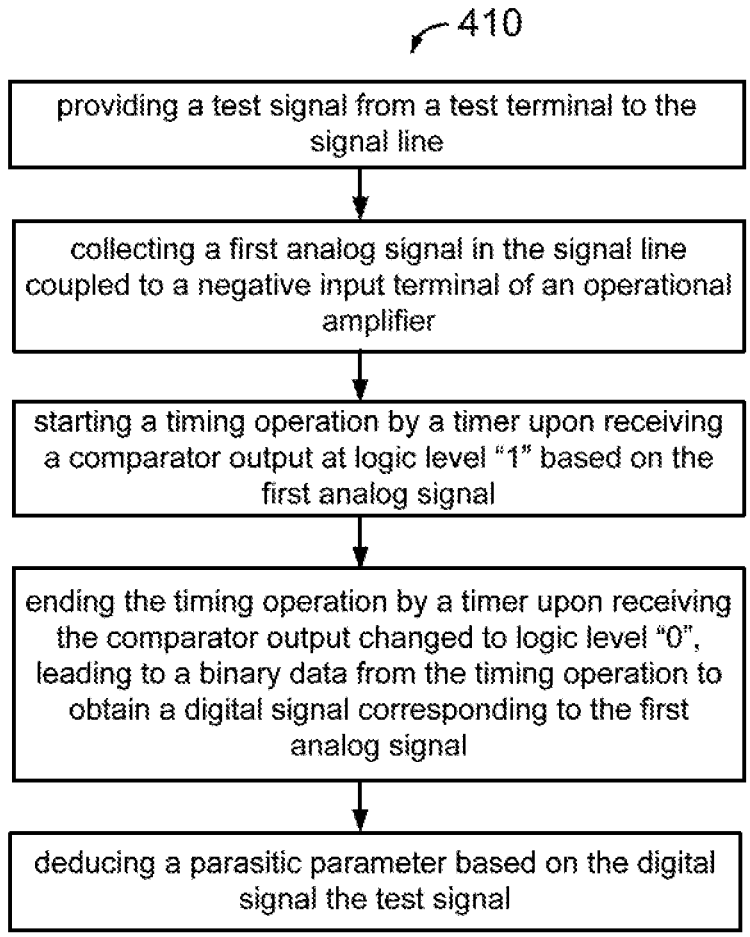
FIG. 4 is a flow chart showing a method for monitoring a parasitic parameter associated with a signal-collection line according to some embodiments of the present disclosure.

FIG. 4 is a flow chart showing a method for monitoring a parasitic parameter associated with a signal-collection line according to some embodiments of the present disclosure. In some embodiments, a monitoring circuit of FIG. 3 is provided for performing the method. Referring to FIG. 4 and in view of the monitoring circuit of FIG. 3, the method 410 includes providing a test current signal from a test input port to the signal-collection line associated with the monitoring circuit to generate a first analog current signal in the signal-collection line based on the test current signal influenced by a parasitic parameter associated with the signal-collection line which is electrically coupled to a subject circuit (e.g., a pixel-driving circuit 100 as shown in FIG. 3).

Referring to FIG. 4, the method 410 further includes collecting the first analog current signal in the signal-collection line by the negative input terminal of the operational amplifier to generate a first output signal to the comparator of the ADC circuit. The method 410 additionally includes starting a timing operation by the timer of the ADC circuit when the first analog current signal is received at the negative input terminal of the operational amplifier. During the timing operation the timer receives a second output signal to be a logic level "1" from the comparator. Furthermore, the method 410 includes ending the timing operation by the timer upon receiving a change of the second output signal from the logic level "1" to a logic level "0". Accordingly, the method 410 includes generating a binary data from the timing operation. The binary data characterizes a first digital signal corresponding to the first analog current signal.

Optionally, the binary data is stored in a register and can be retrieved by an external IC chip. Optionally, the binary data can be directly sent to the external IC chip. Optionally, the external IC chip stores a lookup table containing a correspondence relationship between the binary data and a current value. The external IC chip is able to search out the current value corresponding to the first digital signal.

Moreover, the method 410 includes determining a current calibration parameter associated with the parasitic parameter of the signal line based on the first digital signal and the test current signal. Optionally, the parasitic parameter is a parasitic capacitance associated with the signal-collection line that is physically coupled to the pixel-driving circuit. The current calibration parameter determined in the test mode described above would be useful for calibrating a driving current during a monitoring mode. For example, giving a test current value of I1, the external IC chip determines that the first analog current $I_{a1}$ corresponds to a lookup table current value of I2. Then, the current calibration parameter $\Delta I$ can be deduced as $\Delta I = I1 - I2$. Optionally, the value of $\Delta I$ for each signal-collection line can be written into the external IC chip for future calibration of the driving current. In other examples, the calibration parameter may be deduced based on an algorithm other than a simple difference between the first analog current signal and the test current signal.

Figure 5:
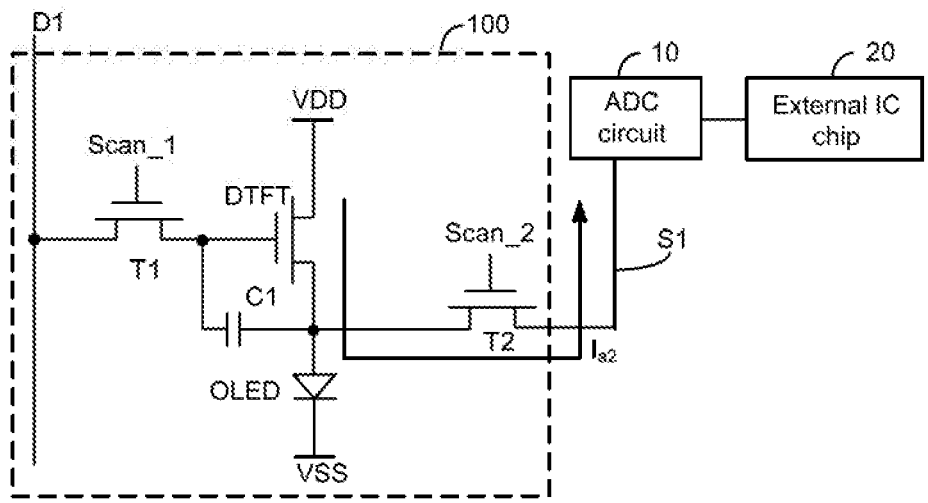
FIG. 5 is a monitoring circuit configured to monitor a driving current of a driving transistor in a pixel-driving circuit according to an embodiment of the present disclosure.

In still another aspect, the present disclosure provides a method for monitoring a driving current of a driving transistor in a pixel-driving circuit. The method is an extension of the method 410 to monitor the driving current through the driving transistor before being compensated via an external electrical compensation using a same monitoring circuit as described above. Referring to FIG. 5, the monitoring circuit includes at least an ADC circuit 10 coupled to an external IC chip 20 and is configured to monitor a driving current $I_d$ of a driving transistor DTFT in a pixel-driving circuit 100. The pixel-driving circuit 100, as an example, also includes a first switch transistor T1 and a capacitor C1. A data signal is applied through a data line D1 to the gate of the driving transistor DTFT to generate a driving current $I_d$, which is a current passing the driving transistor DTFT before being used for controlling an organic light-emitting diode (OLED). In order to make the light emitted from each OLED more uniformly in the display apparatus, this driving current $I_d$ needs individually compensated before being used to actually control the OLED. But before properly performing the compensation, the driving current $I_d$ needs to be monitored and measured accurately.

As shown in FIG. 5, the monitoring circuit is configured to use a signal-collection line S1 to collect the driving current $I_d$ by connecting the signal-collection line S1 to the source terminal of the driving transistor DTFT indirectly through a second switch transistor T2. Once the connection is established between the signal-collection line S1 and a second analog current signal $I_{a2}$ is generated therein. The second analog current signal $I_{a2}$ is different from the driving current Id in value because of the parasitic capacitance of the signal-collection line under the circuitry configuration (FIG. 5). Once the second analog current signal $I_{a2}$ is inputted to the ADC circuit 10 of the monitoring circuit, a digital signal can be obtained. Through an analysis of an external IC chip 20 on the digital signal, the driving current $I_d$ of the driving transistor DTFT before being compensated can be deduced. Then, how large the threshold voltage drift and electron mobility drift of the driving transistor DTFT can be calculated based on the driving current $I_d$.

Figure 6:
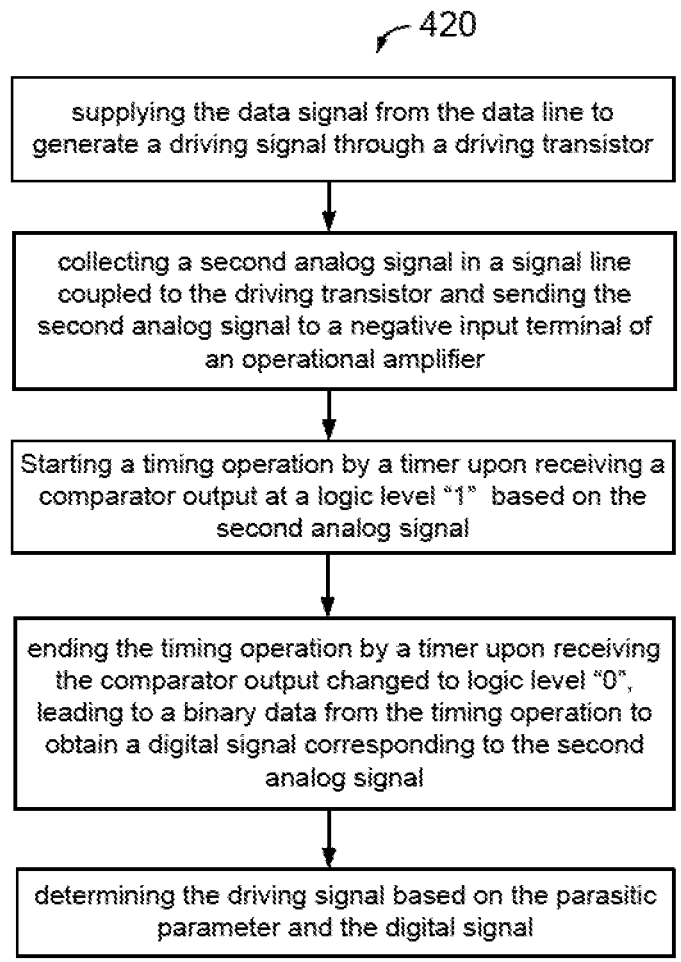
FIG. 6 is a flow chart showing a method for monitoring a driving current of a driving transistor in a pixel-driving circuit according to an embodiment of the present disclosure.

FIG. 6 shows a flow chart of illustrating a method for monitoring the driving current of a pixel-driving circuit using the monitoring circuit described herein in FIG. 5. Referring to FIG. 6 in view of the circuit diagram in FIG. 5, the method 420 includes supplying the data signal from the data line D1 to generate a driving current $I_d$ passing through the driving transistor DTFT to a source terminal. Then, the method 420 includes coupling the signal-collection line S1 via a switch transistor T2 to the source terminal to generate a second analog current signal $I_{a2}$ in the signal-collection line S1. The second analog current signal $I_{a2}$ is different from the driving current $I_d$ because of certain parasitic parameters associated with the signal-collection line S1 under the circuitry configuration as shown in FIG. 5. Additionally, the method 420 includes collecting the second analog current signal $I_{a2}$ by coupling the signal-collection line S1 to the negative input terminal of the operational amplifier of the ADC circuit 10. The method 420 further includes starting a timing operation by the timer of the ADC circuit 10 when the second analog current signal $I_{a2}$ is received at the negative input terminal, during which the timer receives a second output signal at a logic level "1" from the comparator of the ADC circuit 10. Furthermore, the method 420 includes ending the timing operation by the timer upon receiving a change of the second output signal from the logic level "1" to a logic level "0". The method 420 further includes generating a binary data from the timing operation which characterizes a second digital signal corresponding to the second analog current signal $I_{a2}$. Moreover, the method 420 includes determining the driving current Id based on the second digital signal and the current calibration parameter.

In an example, the second digital signal, or simply the binary data resulted from the timing operation, can be stored in a register or memory chip can be further extracted by an external IC chip 20 coupled to the ADC circuit 10. Optionally, the external IC chip 20 can process the second digital signal and use a pre-stored lookup table to determine a current value I3 corresponding to the binary data which is resulted from the second analog current signal $I_{a2}$. Assuming a current calibration parameter ΔI has been obtained previously by executing the method 410 shown in FIG. 4 under a same circuitry configuration except that a test current signal is provided to the signal-collection line from a test input port INPUT. The current calibration parameter ΔI now can be used to calibrate the current value I3 to obtain an actual driving current $I_d$ that passes the driving transistor DTFT. Optionally, Id=I3+ΔI. Optionally, other possible uses of the current calibration parameter and other calibration algorithms may be applicable without altering the features described herein. In general, the monitoring circuit is able to measure the driving current Id before it is properly compensated and used to drive the OLED for emitting light more uniformly in the display apparatus.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

The invention claimed is:

1. A pixel compensation circuit of a display panel comprising an analog-to-digital conversion (ADC) circuit,
   wherein the ADC circuit comprises:
   an integral circuit including an operational amplifier and an integral capacitor;
   a comparator; and
   a timer;
   wherein the operational amplifier includes a positive input terminal configured to receive a first voltage, a negative input terminal coupled to a signal-collection line configured to collect an analog current signal, and an output terminal configured to output a first output signal;
   the integral capacitor is coupled between the negative input terminal and the output terminal;
   the comparator is configured to compare the first output signal with a second voltage to generate a second output signal to the timer;
   the timer is configured to start a timing operation when the operational amplifier receives the analog current signal from the signal-collection line and end the timing operation when the second output signal changes, wherein a binary data resulted from the timing operation characterizes a digital signal corresponding to the analog current signal; and
   the signal-collection line is coupled to a driving transistor and a testing signal input terminal.

2. The pixel compensation circuit of claim 1, wherein the second voltage is smaller than the first voltage and the first output signal is no greater than the first voltage.

3. The pixel compensation circuit of claim 2, further comprising a reset sub-circuit coupled to both the negative input terminal and the output terminal of the operational amplifier, the reset sub-circuit being configured to reset the integral circuit when the timer ends a timing operation.

4. The pixel compensation circuit of claim 3, wherein the reset sub-circuit includes a first switch between the negative input terminal and the output terminal of the operational amplifier and a second switch between the signal-collection line and the negative input terminal of the operational amplifier.

5. The pixel compensation circuit of claim 4, wherein each of the first switch and the second switch is a switch transistor comprising one or more N-type or P-type transistors.

6. The pixel compensation circuit of claim 4, wherein the first switch is turned off and the second switch is turned off to connect the signal-collection line to the negative input terminal of the operational amplifier to generate the first output signal that is decreasing from the first voltage towards the second voltage in a voltage conversion period during which the second output signal is a logic level "1" and the timer performs the timing operation.

7. The pixel compensation circuit of claim 6, wherein the second output signal comprises a change from the logic level "1" to a logic level "0" when the first output signal becomes smaller than the second voltage, thereby ending the voltage conversion period and starting a reset period.

8. The pixel compensation circuit of claim 7, wherein the first switch is turned on and the second switch is turned off to disconnect the signal-collection line from the negative input terminal of the operational amplifier to set the operational amplifier in a negative feedback mode to in the reset period to reset the first output signal to the first voltage.

9. The pixel compensation circuit of claim 1, further includes a level-conversion sub-circuit between the output terminal of the comparator and the timer, wherein the level-conversion sub-circuit is configured to reduce a voltage level of the second output signal for power saving.

10. The pixel compensation circuit of claim 1, further comprising a timing-control sub-circuit coupled to the timer and configured to force the timer to end a timing operation and reset the timer when the timer fails to end the timing operation in a preset time period.

11. The pixel compensation circuit of claim 1, further comprising a register coupled to the timer and configured to store the binary data resulted from the timing operation and to send the binary data to an external processor, the binary data being positively correlated to the analog current signal.

12. A display apparatus, comprising the pixel compensation circuit of claim 1, and a display panel.

13. A method for converting an analog signal to a digital signal using an analog-to-digital conversion (ADC) circuit, wherein the ADC circuit comprises:
an integral circuit including an operational amplifier and an integral capacitor;
a comparator; and
a timer;
wherein the operational amplifier includes a positive input terminal configured to receive a first voltage, a negative input terminal coupled to a signal-collection line configured to collect an analog current signal, and an output terminal configured to output a first output signal;
the integral capacitor is coupled between the negative input terminal and the output terminal;
the comparator is configured to compare the first output signal with a second voltage to generate a second output signal to the timer; and the timer is configured to start a timing operation when the operational amplifier receives the analog current signal from the signal-collection line and end the timing operation when the second output signal changes, wherein a binary data resulted from the timing operation characterizes a digital signal corresponding to the analog current signal;
wherein the method comprises:
operating the timer to start a timing operation when the analog current signal collected by the signal-collection line is received by the negative input terminal of the operational amplifier;
ending the timing operation when the second output signal received by the timer changes;
storing a binary data resulted from the timing operation in a register coupled to the timer, wherein the binary data characterizes a digital signal positively correlated to the analog current signal.

14. The method of claim 13, wherein operating the timer to start a timing operation comprises outputting a first output signal from the output terminal of the operational amplifier in a positive feedback mode with a first voltage being provided to the positive input terminal and the analog current signal being provided to the negative input terminal, the first output signal being a voltage signal that is decreasing with a drop rate proportional to the analog current signal.

15. The method of claim 13, wherein operating the timer to start a timing operation further comprises operating the comparator to compare the first output signal with a second voltage to generate a second output signal outputted to the timer, wherein the second output signal is a logic level "1" if the first output signal is greater than or equal to the second voltage, the second output signal changes to a logic level "0" if the first output signal is smaller than the second voltage.

16. The method of claim 15, wherein operating the timer to start a timing operation comprises measuring a time duration of the second output signal staying at the logic level "1" before changing to the logic level "0" to obtain the binary data positively correlated to the time duration which is negatively correlated to the drop rate.

17. The method of claim 13, further comprising resetting the integral circuit when the timer ends the timing operation to set the first output signal equal to the first voltage.

18. A method for monitoring a parasitic parameter associated with a signal-collection line coupled to a subject circuit using an analog-to-digital conversion (ADC) circuit, wherein the ADC circuit comprises:
an integral circuit including an operational amplifier and an integral capacitor;
a comparator; and
a timer;
wherein the operational amplifier includes a positive input terminal configured to receive a first voltage, a negative input terminal coupled to a signal-collection line configured to collect an analog current signal, and an output terminal configured to output a first output signal;
the integral capacitor is coupled between the negative input terminal and the output terminal;
the comparator is configured to compare the first output signal with a second voltage to generate a second output signal to the timer; and
the timer is configured to start a timing operation when the operational amplifier receives the analog current signal from the signal-collection line and end the timing operation when the second output signal changes, wherein a binary data resulted from the timing operation characterizes a digital signal corresponding to the analog current signal;

wherein the method comprises:

providing a test current signal from a test terminal to the signal-collection line, wherein a first analog current signal is generated in the signal-collection line based on the test current signal influenced by the parasitic parameter;

collecting the first analog current signal in the signal-collection line by the negative input terminal of the operational amplifier to generate a first output signal to the comparator of the ADC circuit;

starting a timing operation by the timer when the first analog current signal is received at the negative input terminal, during which the timer receives a second output signal to be a logic level "1";

ending the timing operation by the timer upon receiving a change of the second output signal from the logic level "1" to a logic level "0";

generating a binary data from the timing operation which characterizes a first digital signal corresponding to the first analog current signal; and determining a current calibration parameter associated with the parasitic parameter based on the first digital signal and the test current signal.

19. The method of claim 18, wherein the subject circuit is a pixel driving circuit configured to generate a driving current to a driving transistor, wherein the driving current is yet to be compensated for driving a light-emitting device based on a data signal sent from a data line to a gate of the driving transistor, further comprising:

supplying the data signal from the data line to generate a driving current passing through the driving transistor to a source terminal;

coupling the signal-collection line via a switch transistor to the source terminal to generate a second analog current signal in the signal-collection line;

collecting the second analog current signal by coupling the signal-collection line to the negative input terminal of the operational amplifier of the ADC circuit;

starting a timing operation by the timer of the ADC circuit when the second analog current signal is received at the negative input terminal, during which the timer receives a second output signal at a logic level "1" outputted from the comparator of the ADC circuit;

ending the timing operation by the timer upon receiving a change of the second output signal from the logic level "1" to a logic level "0";

generating a binary data from the timing operation which characterizes a second digital signal corresponding to the second analog current signal; and determining the driving current based on the second digital signal and the current calibration parameter.

20. The method of claim 19, wherein the first digital signal is converted to a first current signal based on a look-up table stored in an external IC chip coupled to the ADC circuit, the current calibration parameter is a difference between the first current signal and the test current signal, the second digital signal is converted to a second current signal, the driving current equals to the sum of the second current signal and the current calibration parameter.

\* \* \* \* \*